(12) United States Patent
Liu et al.

(10) Patent No.: US 10,321,612 B2
(45) Date of Patent: Jun. 11, 2019

(54) POWER CONVERSION DEVICE

(71) Applicant: Delta Electronics (Thailand) Public Company Limited, Samutprakarn (TH)

(72) Inventors: Dagang Liu, Samutprakarn (TH); Junlai Huang, Samutprakarn (TH); Xuanshun Qi, Samutprakarn (TH); Kai Dong, Samutprakarn (TH); Zhongwei Ke, Samutprakarn (TH)

(73) Assignee: DELTA ELECTRONICS (THAILAND) PUBLIC COMPANY LIMITED, Samutprakarn (TH)

( * ) Notice: Subject to any disclaimer, the term of this patent is extended or adjusted under 35 U.S.C. 154(b) by 0 days.

(21) Appl. No.: 16/006,574

(22) Filed: Jun. 12, 2018

(65) Prior Publication Data

US 2019/0059179 A1 Feb. 21, 2019

(30) Foreign Application Priority Data

Aug. 15, 2017 (CN) .......................... 2017 1 0696372

(51) Int. Cl.
| | |
|---|---|
| *H02M 1/44* | (2007.01) |
| *H05K 7/20* | (2006.01) |
| *H05K 1/02* | (2006.01) |
| *H05K 1/14* | (2006.01) |
| *H05K 7/14* | (2006.01) |

(Continued)

(52) U.S. Cl.
CPC .......... *H05K 7/20909* (2013.01); *H02M 1/44* (2013.01); *H05K 1/0233* (2013.01); *H05K 1/141* (2013.01); *H05K 7/20172* (2013.01); *H02M 1/14* (2013.01); *H02M 3/33576* (2013.01); *H05K 7/1492* (2013.01); *H05K 2201/1003* (2013.01); *H05K 2201/10015* (2013.01); *H05K 2201/10053* (2013.01); *H05K 2201/10272* (2013.01); *H05K 2201/10363* (2013.01); *H05K 2201/10409* (2013.01); *H05K 2201/10522* (2013.01)

(58) Field of Classification Search
CPC .................................................. H05K 7/20909
See application file for complete search history.

(56) References Cited

U.S. PATENT DOCUMENTS

| | | | |
|---|---|---|---|
| 6,515,858 B2* | 2/2003 | Rodriguez | ......... H05K 7/20909 |
| | | | 165/104.33 |
| 6,849,943 B2* | 2/2005 | Thurk | ..................... H02M 1/44 |
| | | | 257/675 |

(Continued)

*Primary Examiner* — Robert J Hoffberg
(74) *Attorney, Agent, or Firm* — Kirton McConkie; Evan R. Witt

(57) ABSTRACT

A power conversion device includes a main board, an electromagnetic interference filter module, an auxiliary power module, a capacitor group, a main power unit, a control plate, an output bus bar and a fan. A first air channel is formed between the auxiliary power module and the electromagnetic interference filter module. A second air channel is formed between two rows of the capacitor group. A third air channel is formed between the two main power conversion modules of the main power unit. The control plate is perpendicularly installed on the main board. The output bus bar is perpendicularly installed on the main board, arranged in parallel with the control plate and located near the control plate. The fan is located near the main power unit and producing airflow to the first air channel, the second air channel and the third air channel.

18 Claims, 10 Drawing Sheets

(51) Int. Cl.
    *H02M 3/335*    (2006.01)
    *H02M 1/14*    (2006.01)

(56)            References Cited

U.S. PATENT DOCUMENTS

| | | | | |
|---|---|---|---|---|
| 7,035,101 | B1* | 4/2006 | Hendrix | G06F 1/20 |
| | | | | 165/104.33 |
| 7,099,154 | B2* | 8/2006 | Ishiyama | G06F 1/184 |
| | | | | 165/121 |
| 7,215,542 | B2* | 5/2007 | Chen | H05K 7/20909 |
| | | | | 219/130.1 |
| 7,495,911 | B2* | 2/2009 | Chen | H05K 7/20909 |
| | | | | 174/16.1 |
| 7,589,964 | B2* | 9/2009 | Li | H05K 7/20909 |
| | | | | 361/694 |
| 7,813,128 | B2* | 10/2010 | Marchand | H05K 7/20909 |
| | | | | 361/694 |
| 10,123,442 | B1* | 11/2018 | Lin | H05K 7/1432 |
| 10,225,935 | B2* | 3/2019 | Chen | H05K 1/18 |
| 2018/0213675 | A1* | 7/2018 | Qi | H05K 7/209 |
| 2019/0058415 | A1* | 2/2019 | Sun | H02M 7/48 |

* cited by examiner

POWER CONVERSION DEVICE

CROSS-REFERENCE TO RELATED APPLICATION

This application claims priority to China Patent Application No. 201710696372.6, filed on Aug. 15, 2017, the entire contents of which are incorporated herein by reference for all purposes.

FIELD OF THE INVENTION

The present invention relates to a power conversion device, and more particularly to a power conversion device which is relatively small in width with a mechanism for facilitating heat dissipation.

BACKGROUND OF THE INVENTION

Nowadays, the servers need more and more power to meet data process requirement. In the server industry, a power system usually comprises a power rack and plural power conversion devices. The power conversion devices are installed in the power rack and are connected with each other in series or in parallel to provide power to other electronic devices. To increase the output power of the power system with same size, there are two ways, one is to increase output power of each power conversion devices, the other is to increase number of power conversion devices. Increasing output power of power conversion devices is usually limited by conditions of input AC connectors, input fusing and datacenter facility. For increasing the number of power conversion devices, since width of the power rack is fixed, the only way is to design the power conversion devices with smaller width.

For reducing the width of the power conversion device, it is necessary to reduce component size, but the small size will increase total power loss and occupy more percentage of air flow channel. So, heat dissipating will be more critical for power conversion devices with smaller width.

Therefore, it is important to provide an improved power conversion device to overcome the above drawbacks.

SUMMARY OF THE INVENTION

An aspect of the present invention provides a power conversion device for increasing the heat dissipating efficiency and reducing the layout space to overcome the drawbacks of the conventional technology. Consequently, the overall width of the power conversion device is reduced, and the power conversion device has enhanced performance.

In accordance with an aspect of the present invention, there is provided a power conversion device. The power conversion device includes a main board, an electromagnetic interference filter module, an auxiliary power module, a main power unit, and a fan. The electromagnetic interference filter module is installed on the main board. The auxiliary power module and the electromagnetic interference filter module are arranged in parallel with each other and separately installed on the main board. A first air channel is formed between the auxiliary power module and the electromagnetic interference filter module. The main power unit is installed on the main board and includes at least two main power conversion modules. The two main power conversion modules are arranged in parallel with each other on the main board. A third air channel is formed between the two main power conversion modules. The fan is producing airflow to the first air channel and the third air channel. The term module in the embodiments may refer to not only component with independent encapsulation, but also a group of components which function as a whole.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
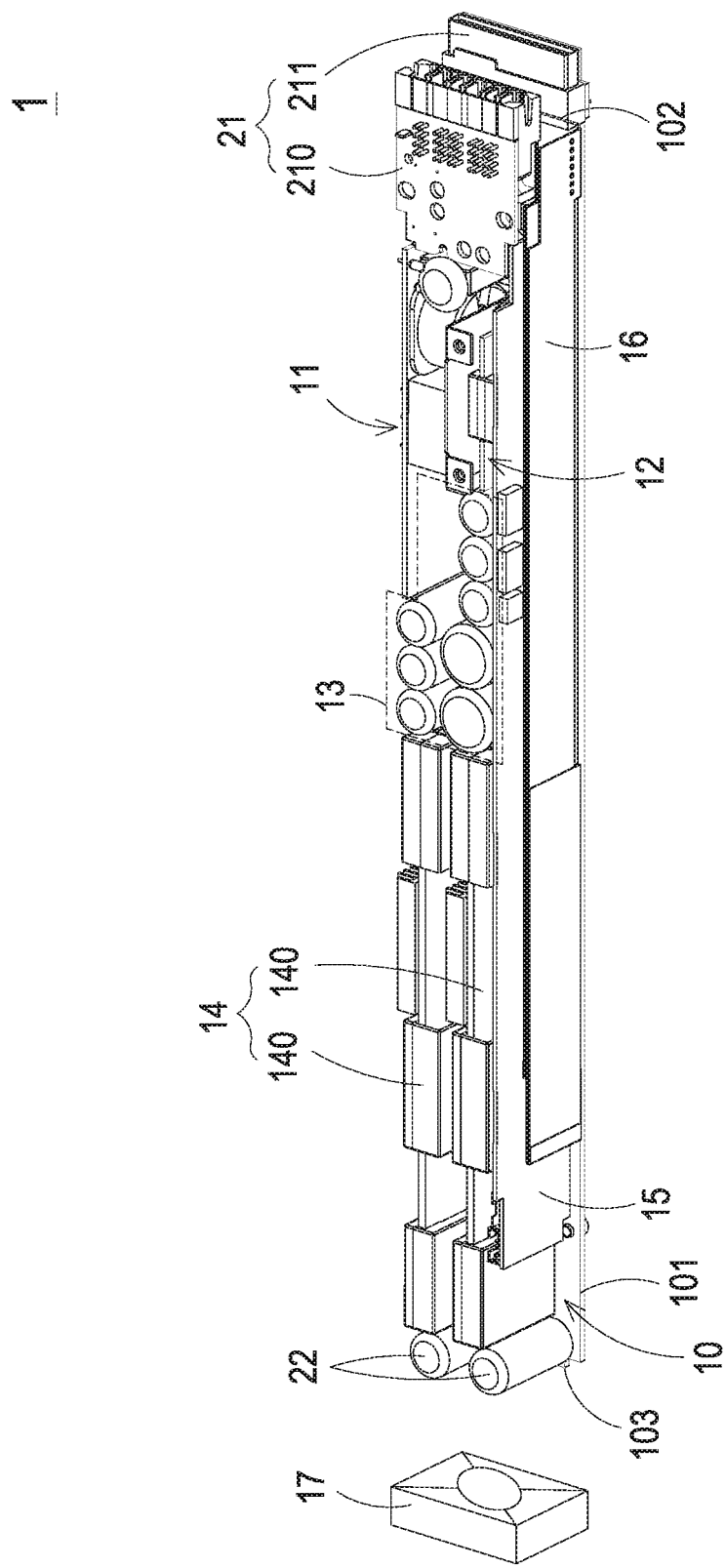
FIG. 1 is a schematic perspective view illustrating a power conversion circuit according to an embodiment of the present invention.
Figure 2:
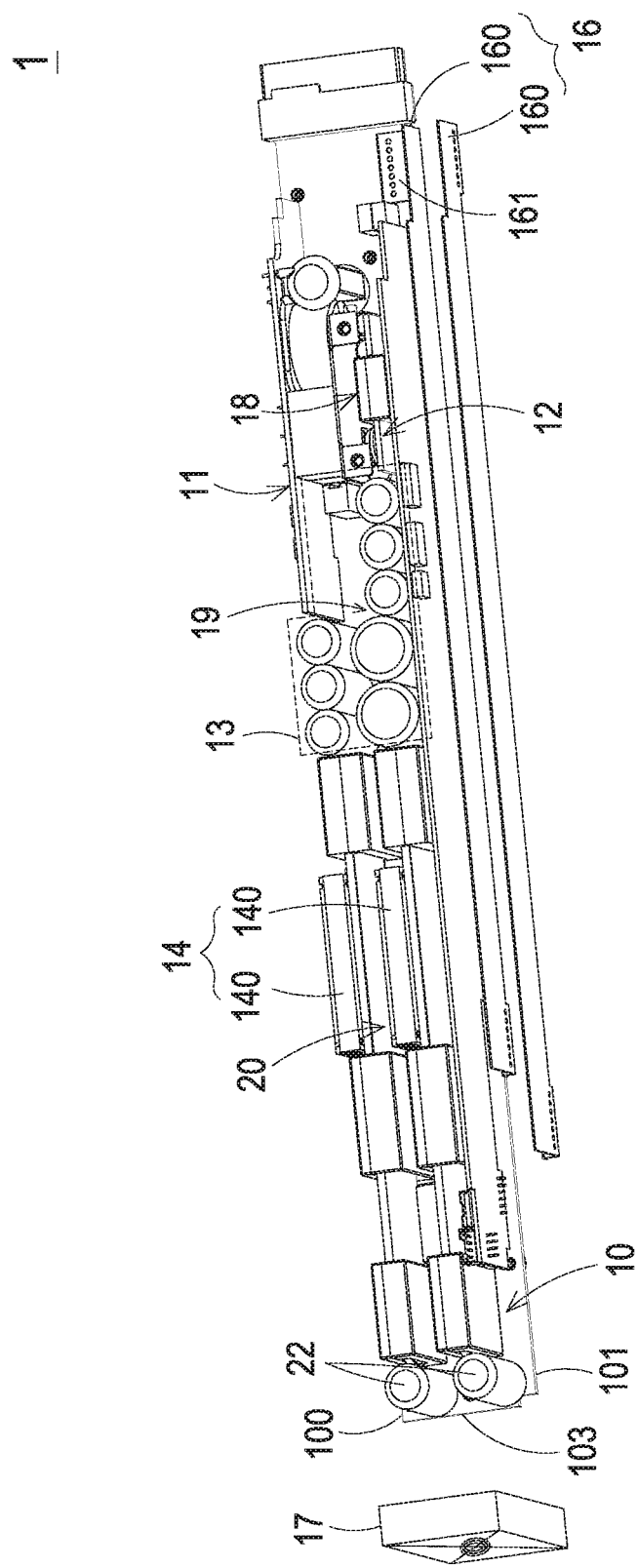
FIG. 2 is a schematic partial exploded view illustrating the power conversion circuit of FIG. 1.
Figure 3:
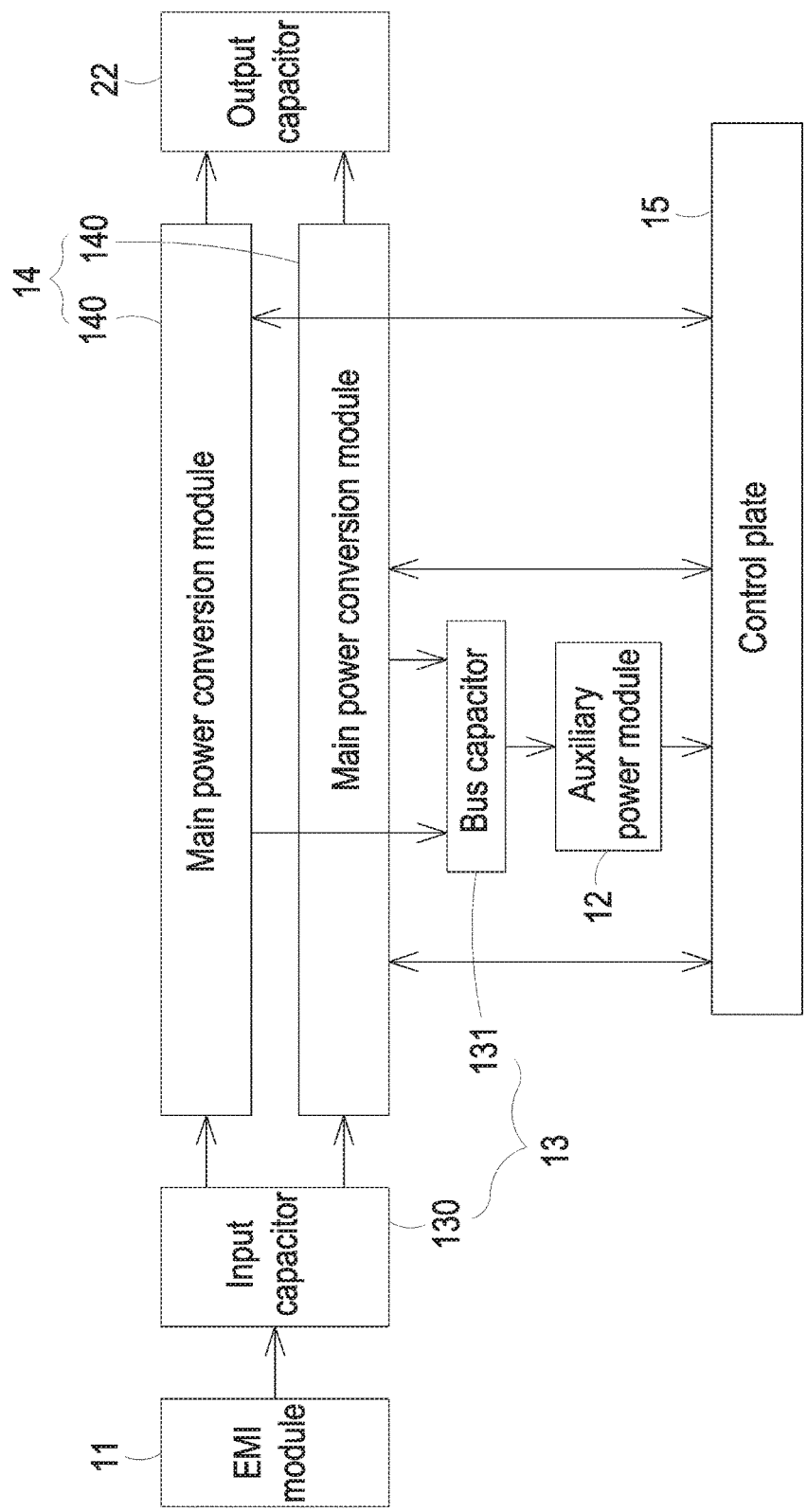
FIG. 3 is a schematic circuit block diagram illustrating a portion of the power conversion circuit of FIG. 1.

FIG. 1 is a schematic perspective view illustrating a power conversion circuit according to an embodiment of the present invention. FIG. 2 is a schematic partial exploded view illustrating the power conversion circuit of FIG. 1. FIG. 3 is a schematic circuit block diagram illustrating a portion of the power conversion circuit of FIG. 1. The power conversion device 1 may be enclosed by a casing (not shown) and installed in a power rack (not shown). In this embodiment, the power conversion device 1 comprises a main board 10, an electromagnetic interference (EMI) filter module 11, an auxiliary power module 12, a capacitor group 13, a main power unit 14, a control plate 15, an output bus bar 16 and a fan 17. The capacitor group 13, the control plate 15 and the output bus bar 16 may be omitted or be transferred to other shape and form in other embodiments. The main board 10 comprises a first edge 100, a second edge 101, a third edge 102 and a fourth edge 103. The first edge 100 and the second edge 101 are opposed to each other. The third edge 102 and the fourth edge 103 are opposed to each other. Moreover, the third edge 102 and the fourth edge 103 are arranged between the first edge 100 and the second edge 101.

The EMI filter module 11 is installed on the main board 10 and located near the first edge 100. The EMI filter module 11 is used for avoiding electromagnetic interference.

The auxiliary power module 12 and the EMI filter module 11 are arranged in parallel with each other and separately installed on the main board 10. The auxiliary power module 12 is located near the second edge 101 while the EMI filter module 11 is located near the first edge 100. Moreover, a first air channel 18 is defined between the auxiliary power module 12 and the EMI filter module 11. Further, the auxiliary power module 12 and the EMI filter module 11 may be arranged along and arranged in parallel with the first edge 100 and the second edge 101, respectively. The auxiliary power module 12 is used for converting a portion of electric power from main power unit 14, and the converted power may be transmitted to the control plate 15 in an isolation manner so as to drive the control plate 15.

The capacitor group 13 is installed on the main board 10 and electrically connected with the EMI filter module 11 and the main power unit 14. In an embodiment, the capacitor group 13 comprises plural capacitors (e.g., two capacitors). The plural capacitors are separately arranged in at least two parallel rows. Moreover, a second air channel 19 is defined between the at least two rows of the capacitors. Preferably, the capacitors in each row are arranged in parallel with the first edge 100 and the second edge 101. Moreover, the plural capacitors of the capacitor group 13 comprise at least one input capacitor 130 and at least one bus capacitor 131. That is, the plural capacitors can be electrically connected with different parts of the power conversion device 1 in order to achieve different functions. The input capacitor 130 may be electrically connected between the output terminal of the EMI filter module 11 and the input terminal of the main power unit 14, which is used for stabilizing the received voltage of the main power unit 14. The bus capacitor 131 may be electrically connected with the main power unit 14 and the auxiliary power module 12, which helps providing the stabilized voltage to the auxiliary power module 12.

The main power unit 14 is installed on the main board 10. Moreover, the main power unit 14 comprises two main power conversion modules 140. The two main power conversion modules 140 are arranged in parallel with each other and separately installed on the main board 10. A third air channel 20 is defined between the two main power conversion modules 140. Moreover, the first air channel 18, the second air channel 19 and the third air channel 20 are in communication with each other to define a fan airflow passageway. In another embodiment, the first air channel 18 and the third air channel 20 may be in communication with each other.

The control plate 15 is installed on the main board 10. The control plate 15 is arranged along the second edge 101 and perpendicular to the main board 10. The control plate 15 is electrically connected with the auxiliary power module 12 and the main power unit 14. The control plate 15 is used for controlling the operations of the power conversion device 1. For example, the control plate 15 is used for sampling the received voltage and current of the power conversion device 1, sampling the outputted voltage and current of the power conversion device 1, controlling the operations of the main power unit 14, detecting and controlling the outputted voltage and current of the auxiliary power module 12, detecting the internal temperature of the power conversion device 1, and controlling the rotating speed of the fan 17.

The output bus bar 16 is perpendicularly installed on the main board 10. Moreover, the output bus bar 16 is located near and in parallel with the control plate 15. Preferably, the output bus bar 16 is made of a conductive material such as copper. The output bus bar 16 is electrically connected with the output terminal of the main power unit 14. In an embodiment, the output bus bar 16 comprises two parallel conductive plates 160, and an insulation material (e.g., an insulation plate) is filled in the space between the two parallel conductive plates 160. Consequently, the two parallel conductive plates 160 are attached near each other with isolation. Moreover, each conductive plate 160 comprises plural insertion terminals 161. The plural insertion terminals 161 are mounted on the main board 10. Moreover, the two conductive plates 160 are respectively used as a positive electrode and a negative electrode for the output voltage of the main power unit 14.

Preferably but not exclusively, the fan 17 is disposed on the casing. The fan 17 produces airflow to the third air channel 20. In one embodiment, since the first air channel 18, the second air channel 19 and the third air channel 20 are in communication with each other, the airflow is transferred through the third air channel 20, the second air channel 19 and the first air channel 18 sequentially. Consequently, the airflow can remove the heat from the electronic components that are located beside the fan airflow passageway. It is noted that the installation position of the fan 17 is not restricted. For example, in another embodiment, the fan 17 is located near the main power unit 14. The fan may also be a system fan which located in the system and located far from the power conversion device, the invention is not limited thereto.

As mentioned above, the auxiliary power module 12 and the EMI filter module 11 are arranged in parallel with each other and separately installed on the main board 10, the plural capacitors of the capacitor group 13 are installed on the main board 10 and separately arranged in at least two parallel rows, the two main power conversion modules 140 are arranged in parallel with each other and separately installed on the main board 10, and the control plate 15 and the output bus bar 16 are perpendicularly installed on the main board 10. The layout space of the main board 10 in the width direction can be saved. That is, the layout space of the main board 10 between the first edge 100 and the second edge 101 is saved. Under this circumstance, the overall width of the power conversion device 1 is reduced. Even if the width of the power rack is fixed, more power conversion devices 1 can be installed in the power rack. Consequently, the performance of the power conversion device 1 is enhanced, and the fabricating cost of the power conversion device 1 is reduced.

In one embodiment, the first air channel 18, the second air channel 19 and the third air channel 20 are sequentially arranged between the third edge 102 and the fourth edge 103. The distance between the third edge 102 and the fourth edge 103 may be longer than the distance between the first edge 100 and the second edge 101. In an embodiment, the distance (width) between the first edge 100 and the second edge 101 is in the range between 35 mm and 55 mm (e.g., 40 mm, 45 mm, or 54 mm).

Figure 4:
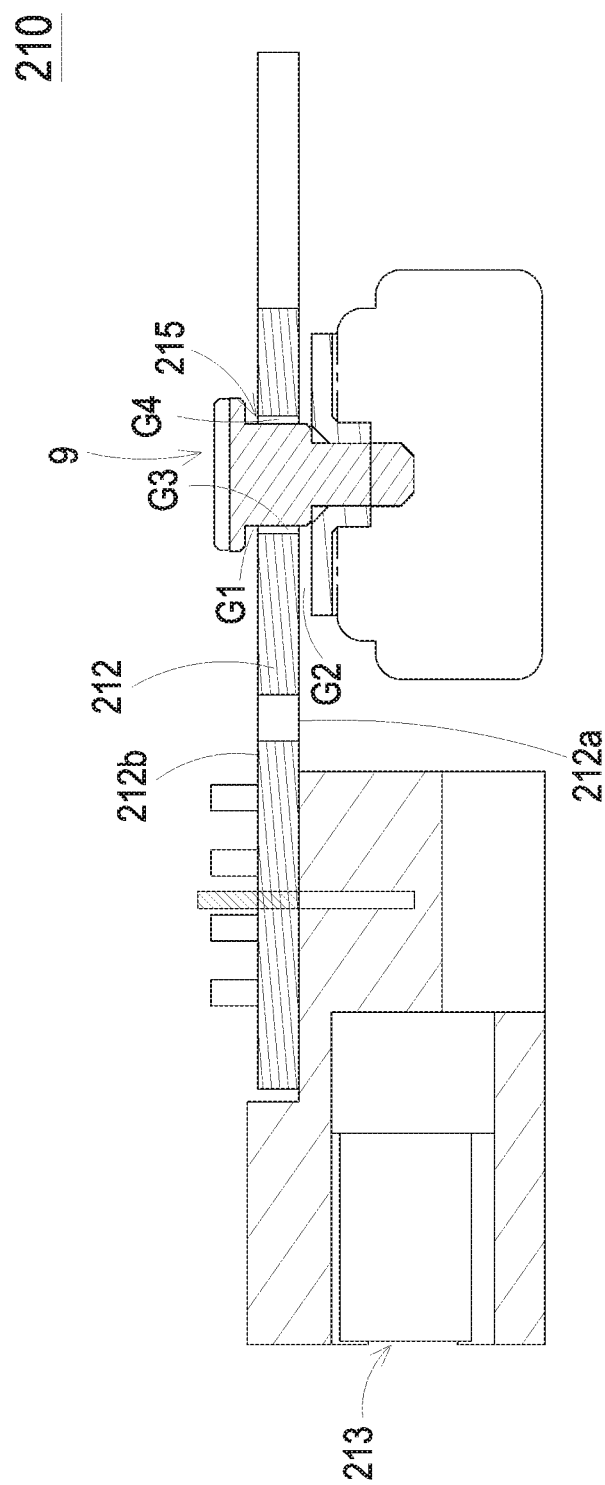
FIG. 4 is a schematic cross-sectional view illustrating an input/output unit of the power conversion device of FIG. 1.
Figure 5:
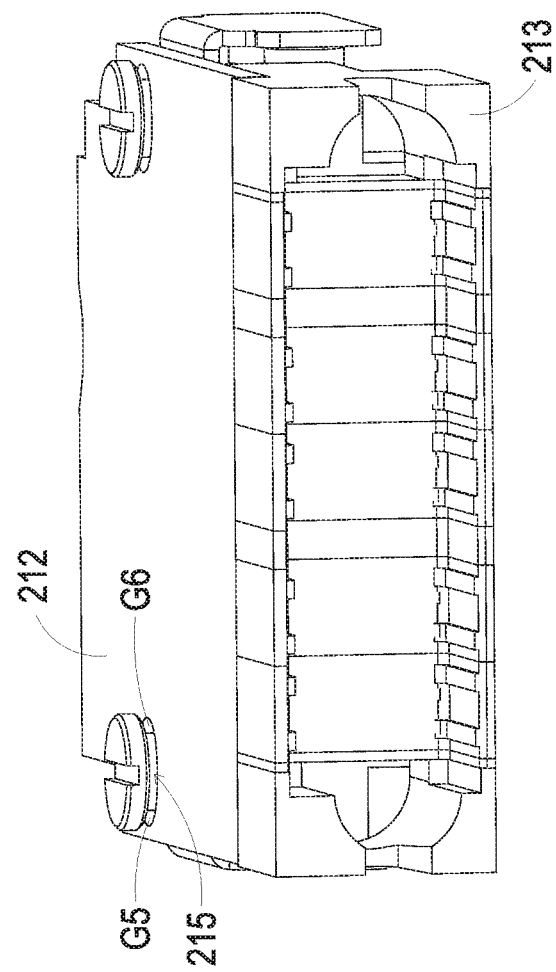
FIG. 5 is a schematic perspective view illustrating the input/output unit of the power conversion device of FIG. 4.

FIG. 4 is a schematic cross-sectional view illustrating an input/output unit of the power conversion device of FIG. 1. FIG. 5 is a schematic perspective view illustrating the input/output unit of the power conversion device of FIG. 1. Please refer to FIGS. 1, 2, 4 and 5. The power conversion device 1 further comprises an input/output unit 21. The input/output unit 21 is installed on the main board 10 and located near the third edge 102. Moreover, the input/output unit 21 comprises an input part 210 and an output part 211, but the invention is not limited thereto. The input part 210 is detachably connected with an external power source (not shown). Moreover, the input part 210 is electrically connected with the EMI filter module 11. When the input part 210 is electrically connected with the external power source, the electric power from the external power source is transmitted to the EMI filter module 11 through the input part 210. The input part 210 comprises an input plate 212 and at least one input terminal 213. The input plate 212 may be connected with the EMI filter module 11 through a jumper wire (not shown). Moreover, the input plate 212 comprises at least one opening 215. The opening 215 runs through a first surface 212a and a second surface 212b of the input plate 212. A portion of a screw 9 is penetrated through the opening 215. A first end of the screw 9 is tightened in the second surface 212b. A second end of the screw 9 is protruded from the first surface 212a and tightened in a fastening part (e.g., a screw hole) of the casing. The input terminal 213 is installed on the input plate 212, and electrically connected with the EMI filter module 11 through the input plate 212 and the jumper wire.

In one embodiment, at least one gap is formed between the screw 9 and the input plate 212. Please refer to FIGS. 4 and 5. There is a first gap G1 between the first end of the screw 9 and the second surface 212b of the input plate 212. There is a second gap G2 between the second end of the screw 9 and the first surface 212a of the input plate 212. There may be other gaps G3-G6 between the screw 9 and the input plate 212. Since the size of the opening 202 is larger than the first end of the screw 9, the input plate 212 is movable relative to the screw 9 in the horizontal direction. Moreover, since there is the first gap G1 between the screw 9 and the input plate 212, the input plate 212 is movable relative to the screw 9 in the vertical direction. The input plate 212 in a floating state can provide buffering to the input terminal 213. Consequently, the input terminal 213 can be plugged into the corresponding device (e.g., the external power source) easily. The output part 211 is disposed under the input part 210 and electrically connected with the output bus bar 16. The output part 211 may comprise plural output terminals (not shown). The electric power of the power conversion device 1 is outputted from some of the output terminals. Associated signals of the power conversion device 1 are outputted from the other output terminals. Since the output part 211 is disposed under the input part 210, the number of the jumper wire for the output part 211 is reduced. Under this circumstance, the interference and the cost are both reduced. In some other embodiments, some components of the EMI filter module 11 may be installed on the input part 210.

In some embodiments, the power conversion device 1 further comprises at least one output capacitor 22. As shown in FIG. 1, the power conversion device 1 comprises two output capacitors 22. The output capacitor 22 is installed on the main board 10 and arranged between the fan 17 and the main power unit 14. The at least one output capacitor 22 is used for reducing the ripple of the output voltage from the main power unit 14. The at least one output capacitor 22 is electrically connected with the output bus bar 16 and the output terminal of the main power unit 14. The output terminals of the two main power conversion modules 140 may be electrically connected with each other in parallel, or the output terminals of the two main power conversion modules 140 may be not even connected with each other, the invention is not limited thereto.

The operation of the power conversion device 1 will be described as follows. Firstly, the electric power from the external power source is received by the input part 210 and transmitted to the EMI filter module 11. Then, the electric power is transmitted to the capacitor group 13 and is further received and converted by the main power unit 14. The converted power is transmitted to the output capacitor 22 and is transmitted to the output part 211 through the output bus bar 16. Then, the filtered power is transmitted to the external device through the output part 211. For example, the external device is a server or a computer. Moreover, a portion of electric power from the main power unit 14 is converted by the auxiliary power module 12 and is transmitted to the control plate 15.

Figure 6:
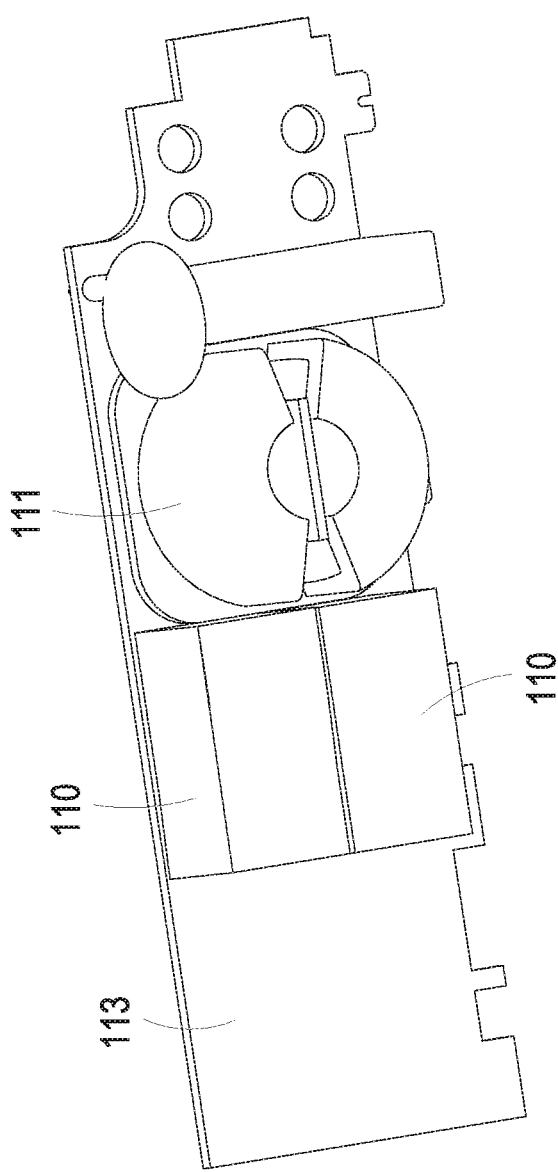
FIG. 6 is a schematic perspective view illustrating the EMI filter module of the power conversion device of FIG. 1.

Hereinafter, the structures of some components of the power conversion device 1 will be described as follows. FIG. 6 is a schematic perspective view illustrating the EMI filter module of the power conversion device of FIG. 1. As shown in FIG. 6, the EMI filter module 11 comprises plural EMI filter components 110, a common mode inductor 111 and a first circuit board 113. The first circuit board 113 is inserted on the main board 10. The EMI filter components 110 and the common mode inductor 111 are disposed on the first circuit board 113. Each of the EMI filter components 110 comprises at least one differential mode capacitor, at least one common mode capacitor and at least one first switch element (not shown).

Figure 7:
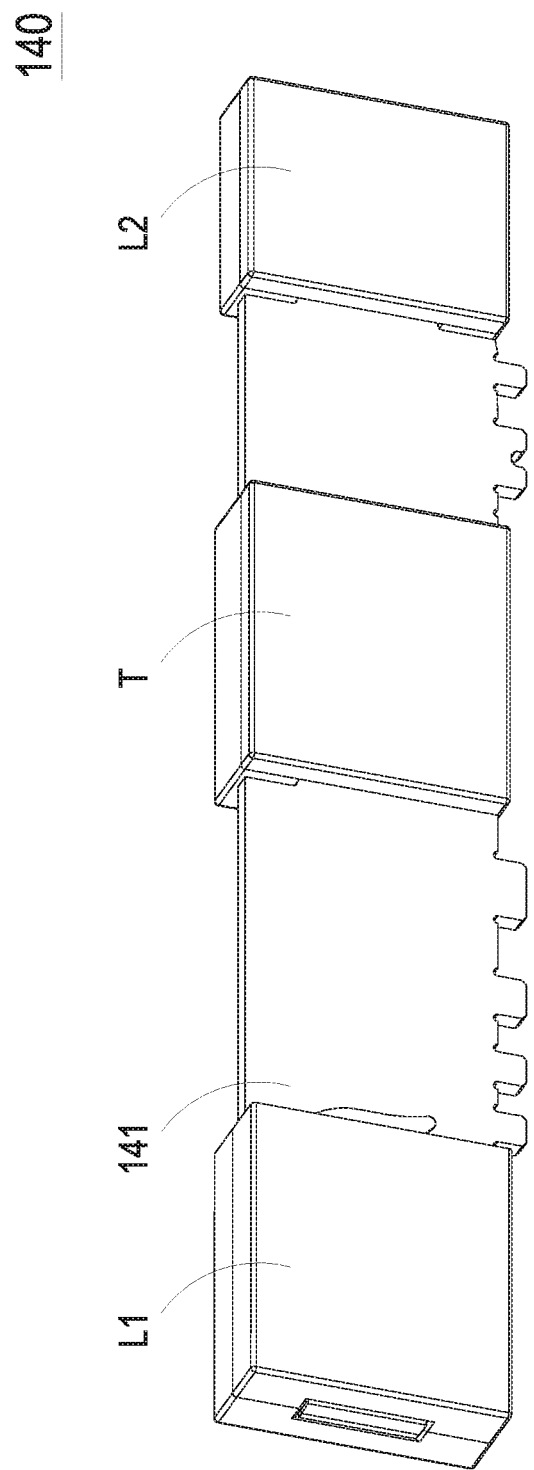
FIG. 7 is a schematic perspective view illustrating the structure of main power conversion module of FIG. 1.
Figure 8:
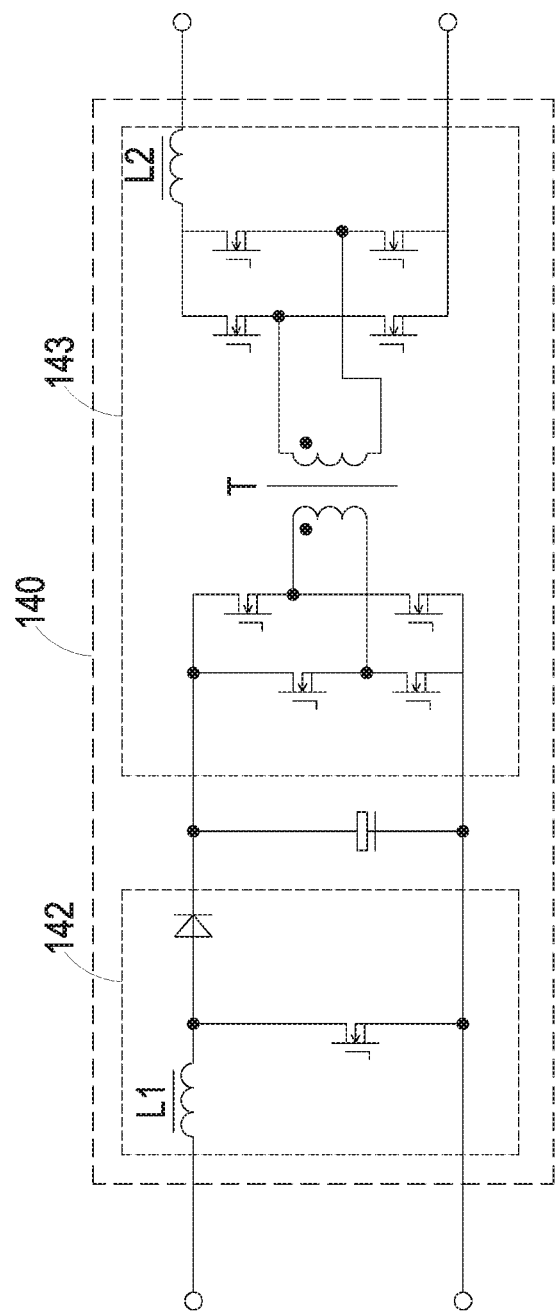
FIG. 8 is a schematic circuit diagram illustrating main power conversion module of FIG. 1.

FIG. 7 is a schematic perspective view illustrating the structure of main power conversion module of FIG. 1. FIG. 8 is a schematic circuit diagram illustrating main power conversion module of FIG. 1. Each main power conversion module 140 has a two-stage circuitry configuration. In an embodiment, the main power conversion module 140 comprises a second circuit board 141, a first conversion circuit 142 and a second conversion circuit 143. The second circuit board 141 is inserted on the main board 10. For example, the first conversion circuit 142 is boost conversion circuit. The output terminal of the first conversion circuit 142 is electrically connected with the input terminal of the second conversion circuit 143. The first conversion circuit 142 and the second conversion circuit 143 are disposed on the second circuit board 141. The first conversion circuit 142 further comprises an input inductor L1 and at least one first switch set. The second conversion circuit 143 may be a full-bridge DC/DC conversion circuit and may comprise a transformer T, at least one second switch set and a filtering inductor L2. The input inductor L1, the transformer T and the filtering inductor L2 may be sequentially arranged on the second circuit board 141. In some embodiments, the first conversion circuit 142 and the second conversion circuit 143 further comprise other electronic components respectively, for example other type switch sets. The circuit topologies of the first conversion circuit 142 and the second conversion circuit 143 can be varied according to the practical requirements. In some embodiments, the windings of the input inductor L1, the transformer T and the filtering inductor L2 are flat coils formed on the second circuit board 141, and thus the overall volume is reduced.

Figure 9:
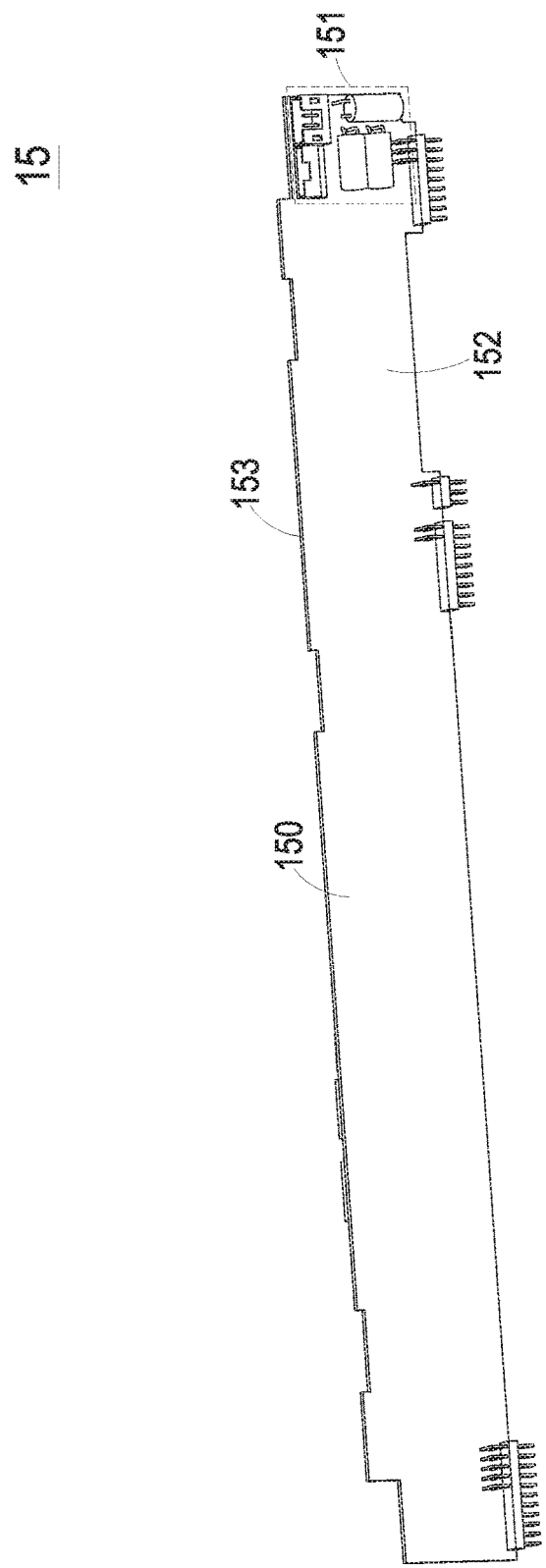
FIG. 9 is a schematic perspective view illustrating the structure of the control plate of FIG. 1.

FIG. 9 is a schematic perspective view illustrating the structure of the control plate of FIG. 1. The control plate 15 comprises a third circuit board 150 and a control circuit 151. The third circuit board 150 is inserted on the main board 10 (see FIG. 1). Moreover, the third circuit board 150 has a first surface 152 and a second surface 153. The first surface 152 is opposite to the second surface 153. The control circuit 151 is disposed on the first surface 152. The control circuit 151 may comprise a microcontroller, a sampling circuit, a detecting circuit and a communication circuit (not shown).

Figure 10:
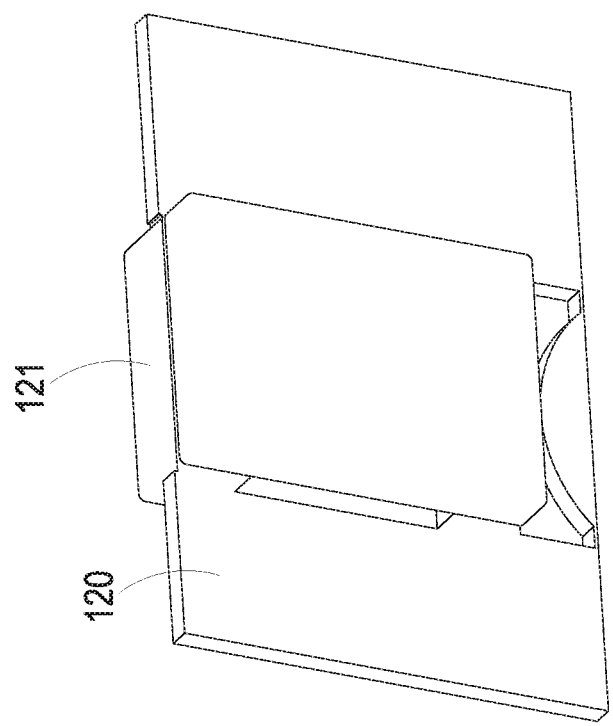
FIG. 10 is a schematic perspective view illustrating the structure of the auxiliary power module of FIG. 1.

FIG. 10 is a schematic perspective view illustrating the structure of the auxiliary power module of FIG. 1. The auxiliary power module 12 comprises a fourth circuit board 120 and an integrated auxiliary component 121. The fourth circuit board 120 is inserted on the main board 10. Moreover, the third circuit board 150, the fourth circuit board 120 and the output bus bar 16 are arranged in parallel with each other. The integrated auxiliary component 121 is installed on the fourth circuit board 120. In an embodiment, the integrated auxiliary component 121 comprises a package structure of a power component (not shown) and a planar transformer (not shown). Since the EMI filter module 11 and the auxiliary power module 12 are separately installed on the main circuit 10, the distance between the common mode inductor 111 of the EMI filter module 11 and the planar transformer of the auxiliary power module 12 is relatively longer. Thus, the coupling effect between the two magnetic components is reduced, the electromagnetic interference is reduced.

From the above descriptions, the embodiments of present invention provide the power conversion device. The auxiliary power module and the EMI filter module are arranged in parallel with each other and separately installed on the main board. The two main power conversion modules are arranged in parallel with each other and separately installed on the main board. The first air channel is defined between the auxiliary power module and the EMI filter module. The third air channel is defined between the two main power conversion modules. The airflow can be transferred through the first air channel and the third air channel to remove the heat from the electronic components. Consequently, the performance of the power conversion device is enhanced, and the fabricating cost of the power conversion device is reduced.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A power conversion device, comprising:
a main board;
an electromagnetic interference filter module installed on the main board;
an auxiliary power module, wherein the auxiliary power module and the electromagnetic interference filter module are arranged in parallel with each other and separately installed on the main board, and a first air channel is formed between the auxiliary power module and the electromagnetic interference filter module;
a main power unit installed on the main board and comprising at least two main power conversion modules, wherein the at least two main power conversion modules are arranged in parallel with each other on the main board, and a third air channel is formed between the at least two main power conversion modules; and
a fan producing airflow to the first air channel and the third air channel.

2. The power conversion device according to claim 1, wherein the main board comprises a first edge, a second edge, a third edge and a fourth edge, wherein the first edge and the second edge are opposed to each other, the third edge and the fourth edge are opposed to each other, and the first air channel and the third air channel are arranged between the third edge and the fourth edge.

3. The power conversion device according to claim 2, wherein a distance between the third edge and the fourth edge is longer than a distance between the first edge and the second edge, and the distance between the first edge and the second edge is in a range between 35 mm and 55 mm.

4. The power conversion device according to claim 3, wherein the distance between the first edge and the second edge is 40 mm, 45 mm or 54 mm.

5. The power conversion device according to claim 2, further comprising an input part and an output part, wherein the input part is electrically connected with an external power source and the electromagnetic interference filter module.

6. The power conversion device according to claim 5, wherein the input part comprises an input plate and at least one input terminal, wherein the input plate is connected with the electromagnetic interference filter module through a jumper wire, an opening runs through a first surface and a second surface of the input plate, and a screw is penetrated through the opening, wherein a first end of the screw is tightened in the second surface of the input plate, a second end of the screw is protruded from the first surface of the input plate and tightened in a fastening part of a casing, the power conversion device is enclosed by the casing, and the at least one input terminal is electrically connected with the electromagnetic interference filter module through the input plate.

7. The power conversion device according to claim 6, wherein the opening is larger than the first end of the screw, so that the input plate is movable relative to the screw in a horizontal direction, wherein there is a gap between the first end of the screw and the second surface of the input plate, so that the input plate is movable relative to the screw in a vertical direction.

8. The power conversion device according to claim 5, further comprising at least one output capacitor, wherein the at least one output capacitor is installed on the main board and arranged between the fan and the main power unit, and the at least one output capacitor is electrically connected with the main power unit.

9. The power conversion device according to claim 1, wherein the electromagnetic interference filter module comprises plural electromagnetic interference filter components, a common mode inductor and a first circuit board, wherein the first circuit board is inserted on the main board, and the plural electromagnetic interference filter components and the common mode inductor are disposed on the first circuit board.

10. The power conversion device according to claim 1, wherein each of the at least two main power conversion modules comprises a second circuit board, a first conversion circuit and a second conversion circuit, wherein the second circuit board is inserted on the main board, and the first conversion circuit and the second conversion circuit are disposed on the second circuit board.

11. The power conversion device according to claim 10, wherein the first conversion circuit comprises an input inductor and at least one first switch set, and the second conversion circuit comprises a transformer, at least one second switch set and a filtering inductor, wherein the input inductor, the transformer and the filtering inductor are sequentially arranged on the second circuit board.

12. The power conversion device according to claim 1, wherein output terminals of the at least two main power conversion modules are electrically connected with each other in parallel.

13. The power conversion device according to claim 1, wherein the fan is fixed on a casing, and the power conversion device is enclosed by the casing.

14. The power conversion device according to claim 1, further comprising: a capacitor group installed on the main board, wherein the capacitor group comprises at least two capacitors, and the at least two capacitors are separately arranged in at least two rows, wherein a second air channel is formed between the at least two rows of the at least two capacitors;

wherein the main power unit is electrically connected with the capacitor group, wherein the first air channel, the second air channel and the third air channel are in communication with each other to define a fan airflow passageway, and the fan produces airflow to the fan airflow passageway.

15. The power conversion device according to claim 1, further comprising:

a control plate perpendicularly installed on the main board, and electrically connected with the auxiliary power module and the main power unit; and an output bus bar perpendicularly installed on the main board, arranged in parallel with the control plate and located near the control plate, wherein the output bus bar is electrically connected with the main power unit.

16. The power conversion device according to claim 15, wherein the output bus bar comprises two parallel conductive plates, and the two parallel conductive plates are attached near each other with an isolation between the two parallel conductive plates, wherein each of the two conductive plates comprises plural insertion terminals, and the two parallel conductive plates are perpendicularly mounted on the main board.

17. The power conversion device according to claim 15, wherein the control plate comprises a third circuit board, and the third circuit board is inserted on the main board.

18. The power conversion device according to claim 17, wherein the auxiliary power module comprises a fourth circuit board, and the fourth circuit board is inserted on the main board, wherein the third circuit board, the fourth circuit board and the output bus bar are arranged in parallel with each other.

* * * * *